(12) United States Patent
Azeroual et al.

(10) Patent No.: US 11,917,749 B1
(45) Date of Patent: Feb. 27, 2024

(54) INTEGRATED CIRCUIT PACKAGE DIFFERENTIAL PIN PATTERN FOR CROSS-TALK REDUCTION

(71) Applicant: Marvell Israel (M.I.S.L) Ltd., Yokne'am (IL)

(72) Inventors: Dan Azeroual, Kiriat Ata (IL); Liav Ben Artsi, Nahariya (IL)

(73) Assignee: Marvell Israel (M.I.S.L) Ltd., Yokne'am (IL)

( * ) Notice: Subject to any disclaimer, the term of this patent is extended or adjusted under 35 U.S.C. 154(b) by 45 days.

(21) Appl. No.: 17/655,912

(22) Filed: Mar. 22, 2022

Related U.S. Application Data

(60) Provisional application No. 63/164,384, filed on Mar. 22, 2021.

(51) Int. Cl.
*H05K 1/02* (2006.01)
*H01L 23/66* (2006.01)
*H05K 3/40* (2006.01)
*H01L 23/50* (2006.01)

(52) U.S. Cl.
CPC ........... *H05K 1/0222* (2013.01); *H01L 23/50* (2013.01); *H01L 23/66* (2013.01); *H05K 1/0228* (2013.01); *H05K 3/40* (2013.01); *H01L 2223/6638* (2013.01)

(58) Field of Classification Search
CPC ...... H05K 1/0222; H05K 1/0228; H05K 3/40; H01L 23/50; H01L 23/60; H01L 2223/6638
See application file for complete search history.

(56) References Cited

U.S. PATENT DOCUMENTS

| | | | |
|---|---|---|---|
| 7,405,477 B1* | 7/2008 | Tao | H05K 1/0243 257/730 |
| 10,091,873 B1* | 10/2018 | Xiong | H05K 1/0287 |
| 10,595,394 B1* | 3/2020 | Kim | H05K 1/113 |
| 10,806,023 B1* | 10/2020 | Puttanna | H05K 1/112 |
| 2009/0188711 A1* | 7/2009 | Ahmad | H05K 1/116 174/262 |
| 2014/0140027 A1* | 5/2014 | Enriquez Shibayama | H01L 24/06 174/250 |
| 2021/0391671 A1* | 12/2021 | Enriquez Shibayama | H01R 12/718 |

* cited by examiner

Primary Examiner — Hoa C Nguyen

(57) ABSTRACT

An integrated circuit package, including a circuit board, signal pins extending orthogonally to the circuit board surface, and grouped into a plurality of differential signal pin pairs, each signal pin pair positioned at a vertex of an array of orthogonal rows and columns, wherein each signal pin pair includes a positive and a negative signal pin. The plurality of signal pin pairs includes a first subset of signal pin pairs wherein the positive and the negative signal pins are arranged in an orientation along a line parallel to rows of the array and a second subset of signal pin pairs in which the positive and the negative signal pins are arranged in an orientation along a line parallel to columns of the array. For each signal pin pair in one of the first and second subsets, each nearest signal pin pairs belong to another of the first and second subsets.

21 Claims, 6 Drawing Sheets

INTEGRATED CIRCUIT PACKAGE DIFFERENTIAL PIN PATTERN FOR CROSS-TALK REDUCTION

CROSS REFERENCE TO RELATED APPLICATION

This disclosure claims the benefit of commonly-assigned United States Provisional Patent Application No. 63/164,384, filed Mar. 22, 2021, which is hereby incorporated by reference herein in its entirety.

FIELD OF USE

This disclosure relates to the assembly of an integrated circuit package and circuit board. More particularly, this disclosure relates to an integrated circuit package with a differential signal pin pattern arrangement that cancels or reduces cross-talk between the signal pins.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Integrated circuit packages are typically mounted onto printed circuit boards (PCBs) by connections at connection points, commonly referred to as pins. These pins may include conventional pins, as well as surface-mount package technology such as land grid array (LGA) packages, pin grid array (PGA) packages, or ball grid array (BGA) packages. As pin pitches become smaller for any of these types of packages (particularly LGA packages which tend to have the smallest pitch), the possibility of cross-talk or interference between pins increases. This may be of particular concern in the case of differential signal pairs, that separately carry a positive signal and a negative signal, because of signal mismatch that may result between positive signal pin and the negative signal pin. The alternative of spacing the pin pairs farther apart may not be desirable, because it would result in either a larger device size or a reduced number of pins that can be accommodated.

SUMMARY

An integrated circuit package, including a printed board having a major place, a first plurality of signal pins, each signal pin in the first plurality of signal pins extending in a first direction orthogonal to the major plane, the first plurality of signal pins being grouped into a second plurality of differential signal pin pairs, each differential signal pin pair in the second plurality of differential signal pin pairs being positioned at a vertex of a regular array of orthogonal rows and columns, wherein each differential signal pin pair in the second plurality of differential signal pin pairs includes a positive signal pin and a negative signal pin, the second plurality of differential signal pin pairs include a first subset of differential signal pin pairs in which, in each differential signal pin pair, the positive signal pin and the negative signal pin are arranged relative to one another in a first orientation along a line parallel to rows of the array and a second subset of differential signal pin pairs in which, in each differential signal pin pair, the positive signal pin and the negative signal pin are arranged relative to one another in a second orientation along a line parallel to columns of the array and for each differential signal pin pair in one of the first and second subsets, all nearest neighbor differential signal pin pairs belong to another of the first and second subsets.

In a first implementation of such an integrated circuit package, further including a plurality of ground pins, extending orthogonally to the major plane in the first direction.

A first aspect of that first implementation of such an integrated circuit package, wherein the ground pins are positioned between differential signal pin pairs disposed in orthogonal rows and columns.

In a first instance of that first aspect wherein additional ground pins are further positioned along a diagonal axis to surround each of the differential signal pin pairs in at least two spatial axes to shield cross-talk signals between neighboring differential signal pin pairs.

In a second instance of that first aspect further including a plurality of ground vias configured to be electrically coupled to a ground of the printed circuit board, wherein at least one of the plurality of ground pins is electrically coupled to at least one of the plurality ground vias.

In a second aspect of that first implementation of such an integrated circuit package, further including a plurality of signal via pairs, each signal via pair having a positive signal via and a negative signal via, and a plurality of via anti-pads, wherein each via anti-pad is configured to separate the printed circuit board from each of the positive and negative signal vias.

In a first instance of that second aspect, wherein at least one of the second plurality of differential pin pairs is electrically coupled to at least one of the plurality of signal via pairs.

In a second instance of that second aspect, further including a plurality of signal trace pairs, routed in a parallel plane to the major plane, configured to transmit each of the differential signals, wherein the signal trace pairs include a positive signal trace and a negative signal trace and the signal trace pairs are routed such that the traces avoid electrical interference with signal via pairs and the second plurality of differential pin pairs.

In a first variant of that second instance, wherein the positive signal pin of each differential signal pin pair in the second plurality of differential signal pin pairs is electrically coupled to the positive signal via of each of the plurality of signal via pairs and the negative signal pin of each differential signal pin pair in the second plurality of differential signal pin pairs is electrically coupled to the negative signal via of the each of the plurality of signal via pairs.

In a second variant of that second instance, wherein the positive pin of each differential signal pin pair in the second plurality of differential signal pin pairs is electrically coupled to the positive signal trace of each of the plurality of signal trace pairs by way of a positive signal via and the negative pin of each differential signal pin pair in the second plurality of differential signal pin pairs is electrically coupled to the negative signal traces of each of the plurality of signal trace pairs by way of a negative signal via.

In a first configuration of that second variant, wherein the positive pin of each differential signal pin pair in the second plurality of differential signal pin pairs is configured to be electrically coupled to a corresponding positive signal pad of a plurality of corresponding signal pads of a substrate and the negative pin of each differential signal pin pair in the second plurality of differential signal pin pairs is configured to be electrically coupled to a corresponding negative signal pad of the plurality of corresponding signal pads of the substrate.

A method of fabricating an electronic device, the method including providing an integrated circuit device package having a plurality of differential signal pin pairs extending in a first direction orthogonal to a surface of the integrated circuit device package, each differential signal pin pair of the plurality of differential signal pin pairs including a positive signal pin and a negative signal pin, wherein each of a first subset of differential signal pin pairs is arranged relative to each other differential signal pin pair of the first subset in a first orientation at a vertex of a regular array of orthogonal rows and columns and along a line parallel to rows of the array, and each of a second subset of differential signal pin pairs is arranged relative to each other differential signal pin pair of the second subset in a second orientation at a vertex of the array and along a line parallel to columns of the array and for each respective differential signal pin pair of the plurality of differential signal pin pairs, forming, on a surface of a substrate, a pair of signal pads being configured in a pattern to accept the corresponding pair of pins, each pair of pads configured to accept a differential signal pin pair positioned at a vertex of the array.

In a first implementation of such a method, further including fabricating a first plurality of signal pads on a surface of the substrate, wherein the substrate is a substrate of a printed circuit board for receiving a corresponding plurality of signal pins of the integrated circuit device package.

In a second implementation of such a method, further including fabricating a first plurality of signal pads on a surface of the substrate, wherein the substrate is a substrate inside an integrated circuit package for receiving a corresponding plurality of signal pins of the integrated circuit device package.

In a third implementation of such a method, further including routing a plurality of signal trace pairs within a printed circuit board on a plane parallel to the surface of the substrate, the signal trace pairs configured to transmit the differential signals, wherein the signal trace pairs include a positive signal trace and a negative signal trace.

In a fourth implementation of such a method, further including electrically coupling a plurality of ground vias to a ground of the printed circuit board.

In a fifth implementation of such a method, further including, for each pair of pads positioned to accept a differential signal pin pair in one of the first and second subsets, fabricating all nearest neighbor pairs of pads such that all nearest neighbor pairs of pads receive differential pin pairs belonging to another of the first and second subsets.

A first aspect of that fifth implementation of such a method, further including electrically coupling a plurality of signal via pairs to each of the plurality of signal trace pairs, wherein the signal via pairs include a positive signal via and a negative signal via, electrically coupling each of the positive signals vias of the plurality of signal via pairs to at least one of the positive signal traces of the signal trace pairs and electrically coupling each of the negative signal vias of the plurality of signal via pairs to at least one of the negative signal traces of the signal trace pairs.

In a first instance of that first aspect, further including positioning a plurality of via anti-pads, wherein each via anti-pad is configured to surround each of the positive and negative signal vias with a non-conductive pocket.

In a first variant of that first instance, wherein in each pair of pads configured to accept a differential signal pin pair in the second plurality of differential signal pin pairs, electrically coupling a pad of the pair of pads, that is configured to accept the positive pin of differential signal pin pair in the second plurality of differential signal pin pairs, to the positive signal via of each of the plurality of signal via pairs and electrically coupling a pad of the pair of pads, that is configured to accept the negative pin of differential signal pin pair in the second plurality of differential signal pin pairs, to the negative signal via of each of the plurality of signal via pairs.

In a sixth implementation of such a method, further including mounting a plurality of ground pads on the surface of the substrate for receiving ground pins, extending orthogonally to the major plane in the first direction.

A first aspect of that sixth implementation of such a method, wherein mounting the plurality of ground pads further includes positioning each of the plurality of ground pads between the orthogonal rows and columns of differential signal pads.

In a first instance of that first aspect, wherein positioning each of the plurality of ground pads further includes surrounding each of the differential signal pad pairs to shield cross-talk signals between neighboring differential signal pad pairs.

BRIEF DESCRIPTION OF THE DRAWINGS

Further features of the disclosure, its nature, and various advantages, will be apparent upon consideration of the following detailed description, taken in conjunction with the accompanying drawings, in which like reference characters refer to like parts throughout, and in which.

DETAILED DESCRIPTION

Figure 1:
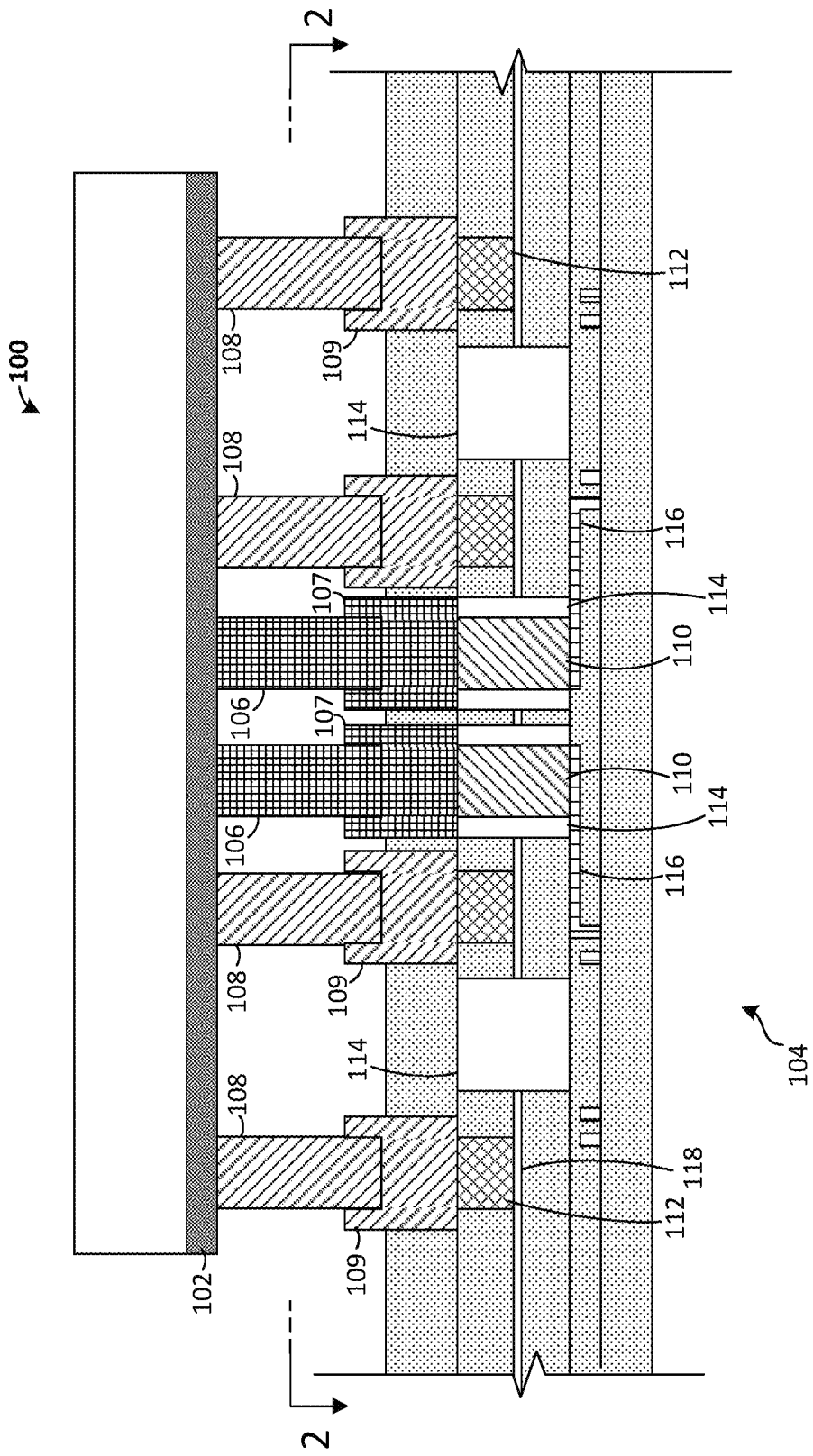
FIG. 1 is a cross-sectional view of an integrated circuit mounted on a printed circuit board, in accordance with implementations of the subject matter of this disclosure.

As discussed above, integrated circuited packages are mounted onto printed circuit boards (PCBs) by connection pins. Some examples of integrated circuited packages are land grid array (LGA) packages, ball grid array (BGA) packages, and pin grid array (PGA) packages. The possibility of cross-talk or interference between differential pin pairs increases as the pin pair pitches become smaller for any of these types of packages (particularly LGA packages which tend to have the smallest pitch). The pitch of the pin pairs refers to the center to center spacing between the closest differential pin pairs. The pitch of the pin pair of the various types of grid array packages may range from 0.5 millimeters to 1.4 millimeters. Specifically, the pins may be more susceptible to inductive or conductive interference from neighboring pins, altering the intended signal through each affected signal pin.

Such interference may result in mismatched signals in the case of differential signal pin pairs that separately carry a positive leg and a negative leg of the same signal. In some implementations of integrated circuit packages, the pin pairs may be spaced further apart to avoid cross-talk, but increasing pin spacing is not a practical solution, because it would result in either a larger device size or a reduced number of pins that could be accommodated without increasing device size.

Therefore, in accordance with implementations of the subject matter of this disclosure, pairs of differential signal pins may be arranged in ways such that cross-talk between adjacent pin pairs may be cancelled or reduced.

Specifically, when considering any two adjacent pairs of differential signal pins, the generation of cross-talk on one signal pin pair (which may be referred to as the "victim" pin pair) caused by the signals on the other signal pin pair (which may be referred to as the "aggressor" pin pair) should be analyzed both from the perspective of a first pin pair being the aggressor pin pair and a second pin pair being the victim pin pair, and from the perspective of the second pin pair being the aggressor pin pair and the first pin pair being the victim pin pair. In any such analysis, the contributions of both of the pins in the aggressor pin pair to cross-talk on any one of the pins in the victim pin pair may be considered.

In implementations of the subject matter of this disclosure, differential signal pin pairs may be arranged in an orthogonal array of pin pairs so that for each differential signal pin pair, a line connecting the two members of the differential signal pin pair is perpendicular to a line connecting the two members of each of the four nearest differential signal pin pairs. As described in more detail below, in such an arrangement, the contribution of the signal in any one pin of a first pin pair, to cross-talk in any one pin of a second pin pair, is balanced by, and therefore cancelled or reduced by, the contribution of the signal in another pin of the first pin pair to cross-talk in that one pin of the second pin pair.

Specifically, in implementations of the subject matter of this disclosure, the pin pairs can be arranged in an array of rows and columns, including two subsets of pin pairs with different orientations. In a first subset of pin pairs, the pins in each pair may be aligned relative to one another along a line extending in a first orientation, while in a second subset of pin pairs, the pins in each pair may be aligned relative to one another along a line extending in a second orientation, which is orthogonal to the first orientation. The pin pairs are placed at the vertices or intersections of the rows and columns of the array, such that each differential pin pair has eight neighboring pin pairs.

For any one pin pair, the four closest neighboring pin pairs out of the eight neighboring pin pairs would be the neighboring pin pairs in the same row or column, and the four farther neighboring pin pairs would be the diagonally adjacent pin pairs. For every differential signal pin pair, belonging to one of the subsets of pin pairs, the four closest pin pair neighbors belong to the other subset of pin pairs, while the four farther pin pair neighbors belong to the same subset of pin pairs. The result is that in any given row or column within the array, the differential pin pairs in that given row or column alternate in their orientations. Therefore, in some implementations, with respect to a given differential pin pair, neighboring pin pairs in the same row and column of the regular array have the opposite spatial orientation, while neighboring pin pairs along a diagonal of the regular array have the same spatial orientation to the given differential pin pair.

It can be shown, as discussed in more detail below, that when the differential pin pairs are distributed in a regular array in the orientations described in the previous paragraph, the contribution of a first pin in one pin pair to cross-talk in any particular pin of a nearest neighboring pin pair is balanced or cancelled by the contribution of the second pin in the one pin pair to cross-talk in that particular pin of the nearest neighboring pin pair. In some implementations, the one differential signal pin pair and the closest neighbor differential signal pin pair are neighboring pin pairs within the rows and columns of pin pairs of the regular array. Each signal pin pair belongs to different orientation pin pair subsets. Both of the one differential signal pin pair and the closest neighboring differential signal pin pair include a positive pin and a negative pin. The one differential signal pin pair may be referred to as the aggressor signal pin pair, and the closest neighbor differential pin pair may be referred to as the victim signal pin pair. Each pin of the aggressor signal pin pair affects each pin of the victim signal pin pair with cross-talk signals (e.g., $C_{pn}$, $C_{pp}$, $C_{nn}$, $C_{np}$). $C_{pn}$ is the cross-talk signal from the positive aggressor pin to the negative victim pin, and $C_{nn}$ is the cross-talk signal from the negative aggressor signal pin to the negative victim pin. Each of the cross-talk signals that affect the negative victim signal pin originate from aggressor pins that are similarly equidistant to the negative victim signal pin. Therefore, in this implementation, the cross-talk signals $C_{pn}$ and $C_{nn}$ may be similarly equivalent in amplitude but opposite in sign, resulting in the cross cancellation of the interference from the cross-talk signals.

In accordance with other implementations of the subject matter of this disclosure, the integrated circuit package may also include a pattern of ground pins between the various neighboring pin pairs to shield against cross-talk between the neighboring pin pairs. In some implementations, the addition of ground pins may provide electromagnetic shielding of each pin pair in at least two spatial axes. The arrangement of signal pin pairs and ground pins may be repeatable, such that the pin arrangement is scalable even with a small pitch between each pin.

In accordance with some implementations of the subject matter of this disclosure, signal pads and ground pads may be arranged on a surface of a substrate for receiving the corresponding plurality of signal pins and plurality of ground pins of an integrated circuit device. In some implementations, the signal pads and ground pads may refer to any structure besides a conventional connection pad (e.g., a socket, a land, a ball) that are configured to receive signal and ground pins, respectively. In some implementations, the substrate may refer to a substrate of a printed circuit board. In other implementations, the substrate may refer to an in-package substrate of the integrated circuit package. In some implementations differential signal pad pairs may be arranged in an orthogonal array of pad pairs so that for each differential signal pad pair, a line connecting the two members of the differential signal pad pair is perpendicular to a line connecting the two members of each of the four nearest differential signal pad pairs. In such an arrangement, each differential signal pad pairs include a positive signal pad and a negative signal pad. In some implementations, each positive signal pad and negative signal pad are configured to accept and electrically couple with each positive signal pin and negative signal pin of the integrated circuit.

Specifically, in implementations of the subject matter of this disclosure, the pad pairs can be arranged in an array of rows and columns, including two subsets of pad pairs with different orientations. In a first subset of pad pairs, the pads in each pair may be aligned relative to one another along a line extending in a first orientation, while in a second subset of pad pairs, the pads in each pair may be aligned relative to one another along a line extending in a second orientation, which is orthogonal to the first orientation. The pad pairs are placed at the vertices or intersections of the rows and columns of the array, such that each differential pad pair has eight neighboring pad pairs, with exception to the pad pairs on any edge of the substrate. In some implementations, the pad pairs are configured to be electrically coupled to the corresponding signal pin pairs that are received from the integrated circuit package.

Interference may occur within the layers of the integrated circuit package, which may be configured to contain signal traces and signal vias. The differential signal pin pairs are configured to be electrically coupled to signal traces by ways of signal vias. In some implementations, each of the positive and negative signal vias may be surrounded by via anti-pads, which are empty, non-conductive pockets in order to isolate each of the signal vias from interfering cross-talk signals. In some implementations there are also ground vias in the integrated circuit package that are configured to be electrically coupled to the ground pins and the integrated circuit package ground.

Interference may also occur within the layers of the printed circuit board, where the signal traces and signal vias are coupled to the signal pad pairs. In accordance with additional implementations of the subject matter of this disclosure, in order to avoid interference between positive signal vias and negative signal vias, via anti-pads may be provided adjacent the vias. The anti-pads help prevent short circuits and cross-talk between the positive signal vias and the negative signal vias. In such implementations, the circuit board also includes ground vias which electrically couple the ground pads to a ground of the circuit board. The positioning of the ground vias may aid in the shielding the signal pin via pairs from each other.

The subject matter of this disclosure may be better understood by reference to FIGS. 1-7.

FIG. 1 is a cross-sectional view of an integrated circuit package 100 mounted on a printed circuit board 104, according to the present disclosure. Integrated circuit package 100 includes an in-package substrate 102, ground pins 108, and differential signal pins 106. The differential signal pins 106 and the ground pins 108 are configured to connect to and electrically couple to the circuit board 204 through signal pads 107 and ground pads 109 that are arranged in the same pattern as the differential signal pins 106 and ground pins 108 arrangement on the integrated circuit package 100. According to the present disclosure, the printed circuit board 104 includes signal pad pairs 107, ground pads 109, signal vias 110, ground vias 112, anti-pads 114, differential signal traces 116 and a ground layer 118, all of which are within various layers. In some implementations, the signal pad pairs 107 are positioned and configured to accept the signal pins 106 of the integrated circuit 100. In some implementations, the ground pads 109 are also positioned and configured to accept the ground pins 108 of the integrated circuit package 100. In these cases, the signal pads 107 are pairs of a positive signal pad and a negative signal pad which are positioned in a similar arrangement as the pin arrangement of the integrated circuits such that each positive signal pad and each negative signal pad may accept each corresponding positive differential signal pin and each negative differential signal pin, respectively.

In some implementations, the signal vias 110 are pairs of a positive signal via and a negative signal via. Each of the signal vias 110 is configured to be electrically coupled to its respective differential signal by respective ones of the differential signal traces 116. The differential signal traces 116 carry positive and negative differential signals along the printed circuit board 104. In some implementations, the ground vias 112 are configured to be electrically coupled to a ground of the circuit board (e.g., a ground layer 118).

In addition, in some implementations, anti-pads 114, or empty non-conductive pockets in the printed circuit board 104 layers may be provided to surround the signal vias 110 for further electrical shielding to reduce cross-talk interference between the signal vias 110. In some implementations, the differential signal pads 107 and ground pads 109 are configured to be electrically coupled such that the positive and negative differential signal pads 107 are electrically coupled to the positive and negative signal vias 110, respectively, and the ground pads 109 are configured to be electrically coupled to the ground vias 112. The line 2 indicates a section of the perspective view, that may be seen as a cross-sectional plan view in FIG. 2

Figure 2:
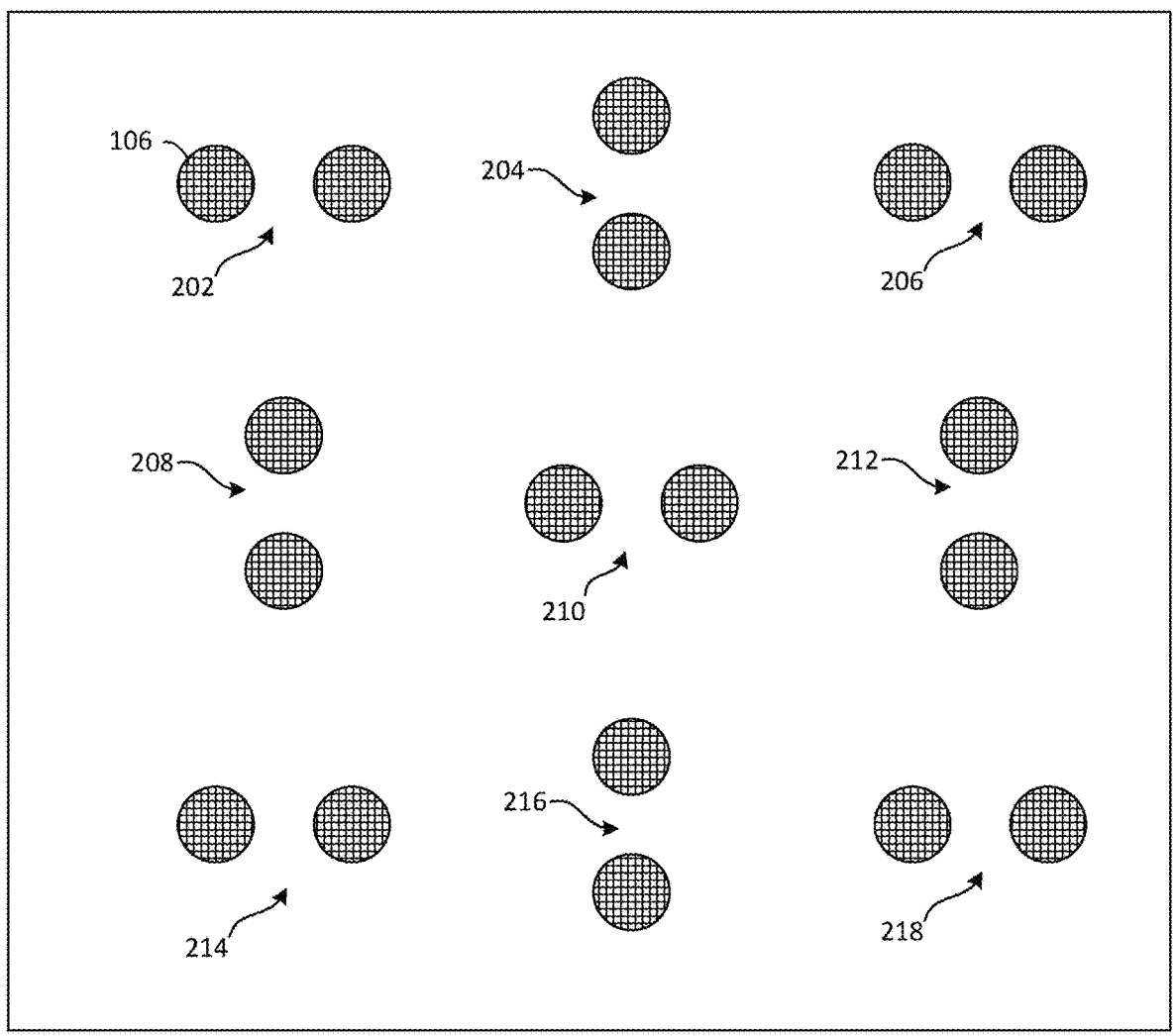
FIG. 2 is a cross-sectional plan view of differential signal pin pairs of an integrated circuit such as that of FIG. 1, taken from line 2-2 of FIG. 1, and arranged in a pin pattern in accordance with implementations of the subject matter of this disclosure.

FIG. 2 shows is a cross-sectional plan view of differential signal pin pairs (i.e., 202, 204, 206, 208, 210, 212, 214, 216, 218) of an integrated circuit package 200 of FIG. 1, taken from line 2-2 of FIG. 1, and arranged in a pin pattern. In some implementations the differential signal pin pair pattern includes a regular array of rows and columns including differential signal pin pairs 202, 204, 206, 208, 210, 212, 214, 216, 218. These differential signal pin pairs may be categorized into two subsets of pin pairs with different orientations. In a first subset of pin pairs, the pins in each pair may be aligned relative to one another along a line extending in a first orientation (i.e., 202, 206, 210, 214, 218), while in a second subset of pin pairs, the pins in each pair may be aligned relative to one another along a line extending in a second orientation (i.e., 204, 208, 212, 216), which is orthogonal to the first orientation. The pin pairs are positioned at the vertices or intersections of the rows and columns of the regular array. The regular array is configured with regular spacing between each vertex or intersection of the rows and columns. In some implementations the vertices or intersections of the rows and columns of the regular array correspond to the center of each differential pin pair. The pin pattern arrangement of FIG. 2 is a portion of the differential pin pairs, and within the pattern, each pin, with the exception to pin pairs positioned at the edge of the integrated circuit package 100 has eight neighboring pin pairs. For any one pin pair (e.g., differential pin pair 210), the four closest neighboring pin pairs out of the eight neighboring pin pairs would be the neighboring pin pairs in the same row or column (i.e., pin pairs 204, 208, 212, 216), and the four farther neighboring pin pairs would be the diagonally adjacent pin pairs (e.g., pin pairs 202, 206, 214, 218). The four closest pin pair neighbors belong to the other subset of pin pairs, meaning that the four closest pin pair neighbors have an orthogonal spatial orientation to the one pin pair. Conversely, the four farther pin pair neighbors belong to the same subset of pin pairs, meaning that the four farther pin pair neighbors have a same spatial orientation relative to the one pin pair. The result is that in any given row or column within the regular array, the differential pin pairs in that given row or column alternate in their spatial orientations, and the differential pin pairs in each diagonal are of the same spatial orientation.

Figure 3:
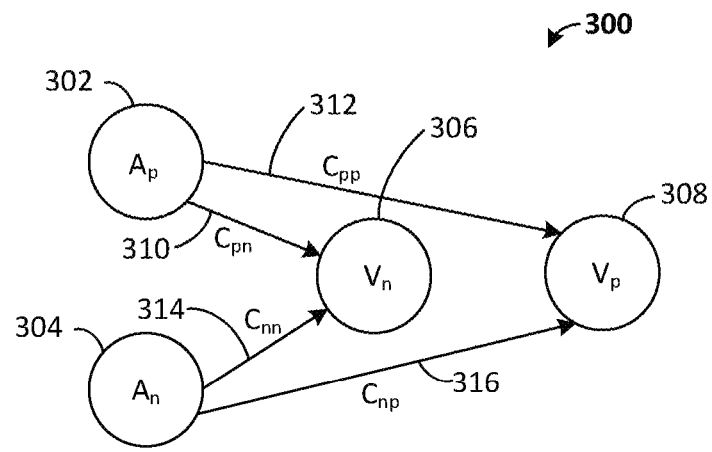
FIG. 3 is a depiction of a pair of aggressor differential signal pins affecting a pair of victim differential signal pins with cross-talk signals, in accordance with implementations of the subject matter of this disclosure.

FIG. 3 is a depiction of a pair of aggressor signal pins 302, 304 affecting a pair of victim signal pins 306, 308 with cross-talk signals 310, 312, 314, 316, in accordance with implementations of the subject matter of this disclosure. In this implementation, the aggressor signal pin pair 302, 304 and the victim signal pin pair 306, 308 are neighboring pin pairs within the rows and columns of pin pairs of the regular array. Each signal pin pair belongs to different orientation pin pair subsets. The aggressor signal pin pair includes an aggressor positive pin 302 and an aggressor negative pin 304.

Each of the aggressor signal pins 302, 304 affect each of the victim signal pins 306, 308, with cross-talk signals (e.g., $C_{pn}$ 310, $C_{pp}$ 312, $C_{nn}$ 314, $C_{np}$ 316). $C_{pn}$ 310 is the cross-talk signal from the positive aggressor signal pin 302 to the negative victim pin 306, and $C_{nn}$ 314 is the cross-talk signal from the negative aggressor signal pin 304 to the negative victim pin 306. Each of the cross-talk signals that affect the negative victim signal pin 306 originate from aggressor pins 302, 304 that are similarly equidistant to the negative victim signal pin 306. The amplitudes of the cross-talk signals are inversely related to the distance between the signal pins. Therefore, in this implementation, the cross-talk signals $C_{pn}$ 310 and $C_{nn}$ 314 may be similarly equivalent in amplitude but opposite in sign, resulting in the cross cancellation of the interference from the cross-talk signals 310, 314. Similarly, there are cross-talk signals directed toward the positive victim pin 308. Cross-talk signals $C_{pp}$ 312 and $C_{np}$ 316 originate from the positive and negative aggressor signal pins 302, 304, respectively, and interfere with the positive victim pin 308. The distances from each of the aggressor signal pins 302, 304 to the positive victim pin 308 are similarly equivalent and therefore the cross-talk signals $C_{pp}$ 312 and $C_{np}$ 316 may cross cancel or reduce each other with similarly equivalent amplitudes and opposite signs. As shown in this implementation, the differential signal pin pairs allow the pin arrangements to provide cross-talk signal cancellation or reduction with positive signal and negative signal components. However, in order for the cross-talk cancellation or reduction to occur throughout the integrated circuit package the pin arrangement may be repeatable such that the net interference between the positive pin and negative pin of each pin pair is about net zero. This can be achieved when the reversed implementation of FIG. 3 yields the same results.

Figure 4:
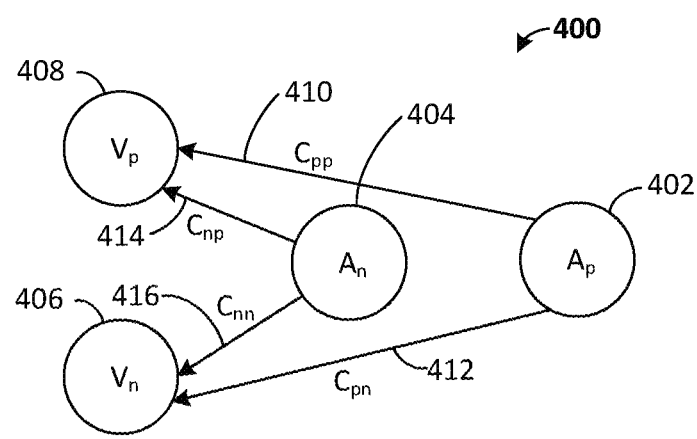
FIG. 4 shows another depiction of a pair of aggressor differential signal pins affecting a pair of victim differential signal pins with cross-talk signals, according to some implementations of the subject matter of this disclosure.
Figure 5:
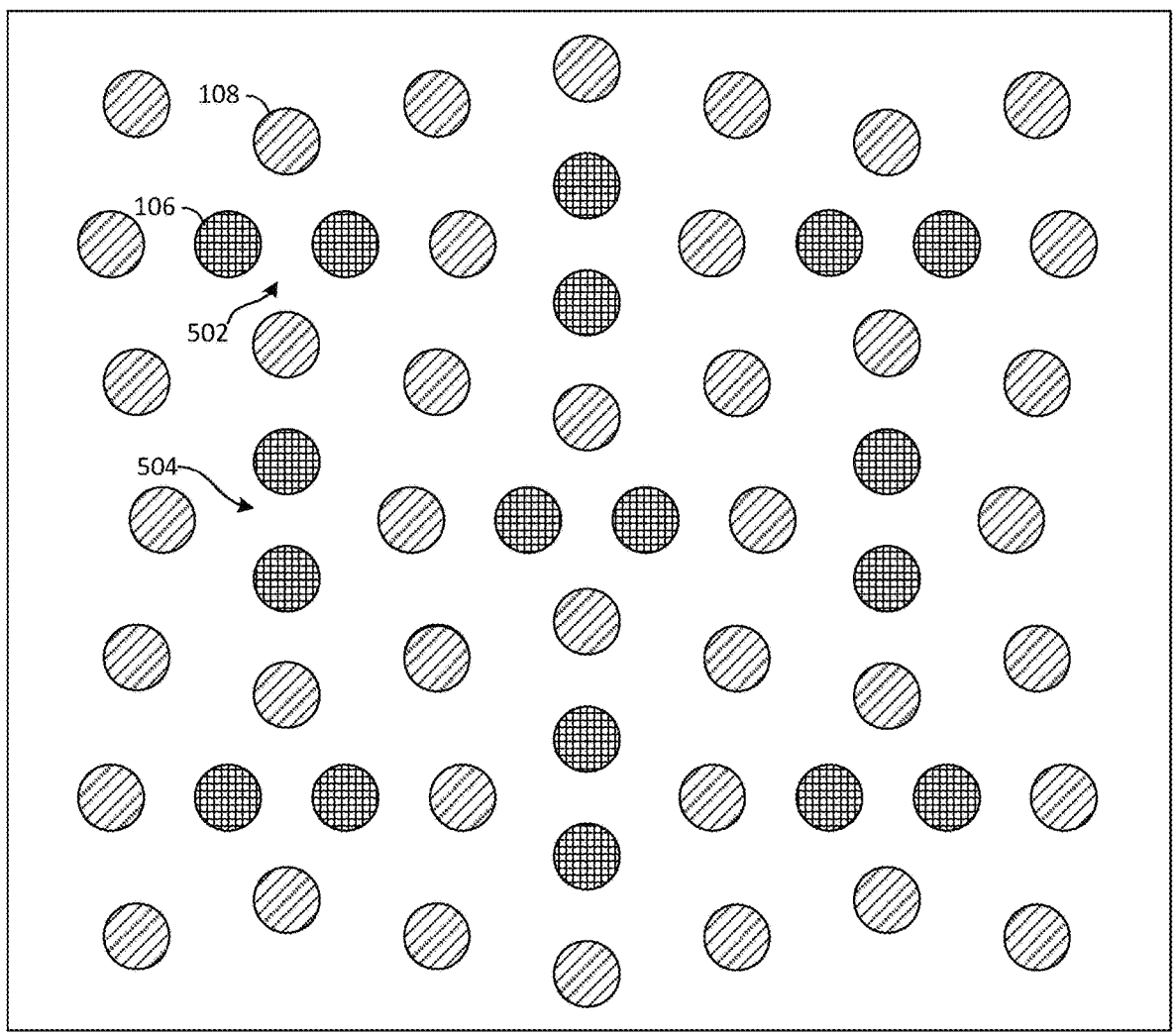
FIG. 5 shows a plan view of a layout of signal pins pairs and ground pins in an integrated circuit package, according to another implementation of the subject matter of this disclosure.

FIG. 4 shows another depiction of a pair of aggressor signal pins 402, 404 affecting a pair of victim signal pins 406, 408 with cross-talk signals 410, 412, 414, 416, according to some implementations. The pin arrangement of FIG. 3 and FIG. 4 are the same, but with a reversal in the roles of aggressors and victims. Similarly, to pin arrangement 400, there are two aggressor pins, a positive aggressor pin 402 and a negative aggressor pin 404, that form an aggressor differential pin pair. There are also two victim pins, a negative victim pin 406 and a positive victim pin 408, which form a victim differential pin pair. The aggressor differential pin pair 402, 404 and the victim differential pin pair 406, 408 belong to differing pin pair orientation sets. The positive victim pin 408 is affected by cross-talk signals $C_{pp}$ 410 and $C_{np}$ 414 from the positive aggressor pin 402 and the negative aggressor pin 404, respectively. The negative victim pin 406 is also affected by the positive aggressor pin 402 and the negative aggressor pin 404 by cross-talk signals $C_{pn}$ 412 and $C_{nn}$ 416. The distances between each of the victim pins 406, 408 and the positive aggressor pin are similarly equivalent, therefore the cross-talk signals $C_{pp}$ 410 and $C_{pn}$ 412 are similarly equivalent. This same logic follows suit for cross-talk signals $C_{np}$ 414 and $C_{nn}$ 416, where each cross-talk signal travels about the same distance from the negative aggressor pin 404 to each of the victim pins 406, 408. Therefore, $C_{np}$ 414 and $C_{nn}$ 416 are similarly equivalent. In this depiction, both the positive victim pin 408 and the negative victim pin 406 are affected by positive cross-talk signals 410, 412 that are similarly equivalent, as well as by negative cross-talk signals 414, 416 that are similarly equivalent. Therefore, it may be determined that each victim pin 406, 408 are receive similar interference, meaning that the net interference of the victim pin pair would be about zero, cancelling or reducing the issues associated with the cross-talk signals. The pin pairs of FIG. 4 illustrate that the cross-talk cancellation or reduction occurs in this aggressor-victim role reversal scenario. This arrangement, when repeated and scaled up on an integrated circuit package, may be able to cancel or reduce the cross-talk signal interference between each differential pin pair. plan view of a layout of signal pins pairs and ground pins in an integrated circuit package FIG. 5 shows a plan view of a layout of differential signal pins pairs 502, 504 including differential pins 106 and ground pins 108 in an integrated circuit package 500, according to the subject matter of the present disclosure. The integrated circuit package 500 shows the repeatable differential signal pin pairs 502, 504, where one set of differential signal pin pairs are of a first orientation 106, and another set of differential signal pin pairs of a second orientation 108. In addition, there are ground pins 108 that extend from the integrated circuit package substrate, similarly to the signal pins 106. The ground pins 108 are positioned such that the ground pins can offer shielding against cross-talk for each of the differential pin pair 502, 504. Each of the ground pins 108 are configured to electrically couple to a circuit board ground. The signal pins 106 and the ground pins 108 are configured to electrically couple to components within layers of the printed circuit board that the integrated circuit package is mounted to.

Figure 6:
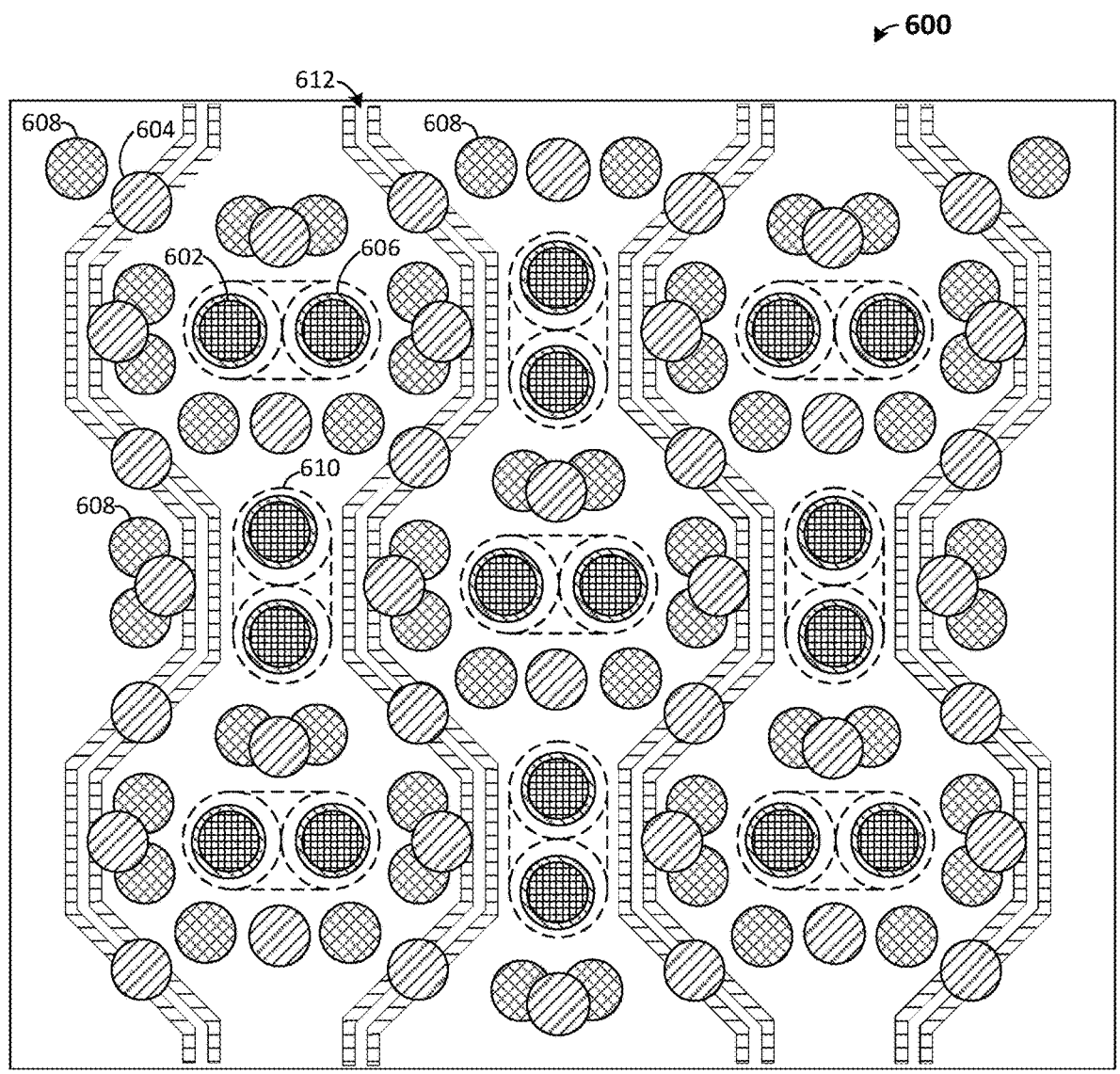
FIG. 6 is a top view of a circuit board taken along line 2-2 of FIG. 1, according to some implementations of the subject matter of this disclosure.

FIG. 6 is a top view of a circuit board 600 taken along line 2-2 of FIG. 1 with the addition of ground vias 608, signal vias 606, anti-pads 610 and signal traces 612, according to some implementations of the subject matter of this disclosure. In some implementations, the differential signal pins 602 and ground pins 604 are configured to be received by a substrate with corresponding connection signal pads and ground pads that match the pin arrangement of the circuit board 600. In some implementations, the differential signal pins 602 and ground pins 604 are configured to be electrically coupled to signals pads and ground pads of the substrate, respectively. The circuit board is configured to include layers with a plurality of signal vias 606, a plurality of ground vias 608, a plurality of anti-pads 610, and a plurality of differential signal traces 612. The vias 606, 608 may be configured to electrically couple the pins 602, 604 to other electrical components within the circuit board. Specially, in some embodiments, the ground vias 608 are configured to be electrically coupled to the ground pins 604 and also to the circuit board ground, which may be an internal layer within the printed circuit board. In addition, the signal vias 606 may be configured to electrically couple to the differential signal pins 602. These signal vias 606 are arranged in pairs, similarly to the differential signal pin pairs 602. In some implementations, the differential signal pin pairs 602 may correspond to the differential signal pin pairs 106 in FIG. 5. In each signal via 606 pair, there is one positive signal via and one negative signal via, each for the respective positive and negative signal pin 602, respectively. Within the circuit board layer in which the signal vias 606 are located, the positive and negative signal vias may interfere with each other depending on the pitch of the signal pin pairs 602. In some embodiments, there may be anti-pads 610, or empty non-conductive pockets within the circuit board layer in order to isolate each of the signal vias 606 within a signal via pair from electrical interference from the other. In addition, according to the present disclosure, differential signal traces 612 are routed such that they may be configured to electrically couple to the signal vias 606. The differential signal traces 612 include two traces, a positive signal trace and a negative signal trace. The differential signal traces 612 route the differential signal throughout the printed circuit board.

Figure 7:
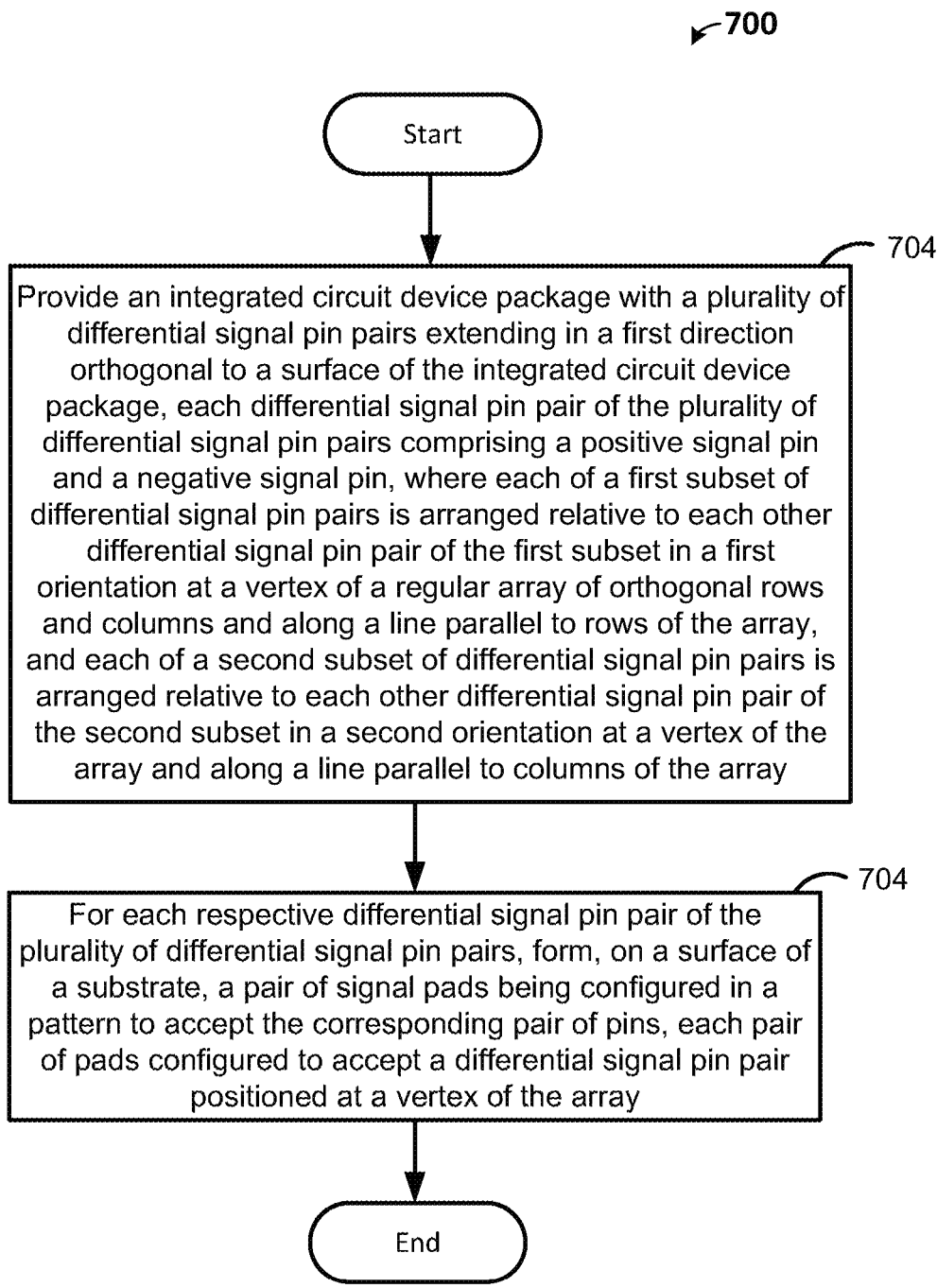
FIG. 7 shows a flowchart of the fabrication of an electronic device according to some implementations of the subject matter of this disclosure.

A method 700 in accordance with implementations of the subject matter of this disclosure is diagrammed in FIG. 7. Method 700 begins at 702, providing an integrated circuit device package with a plurality of differential signal pin pairs extending in a first direction orthogonal to a surface of the integrated circuit device package, each differential signal pin pair of the plurality of differential signal pin pairs comprising a positive signal pin and a negative signal pin, where each of a first subset of differential signal pin pairs is arranged relative to each other differential signal pin pair of the first subset in a first orientation at a vertex of a regular array of orthogonal rows and columns and along a line parallel to rows of the array, and each of a second subset of differential signal pin pairs is arranged relative to each other differential signal pin pair of the second subset in a second orientation at a vertex of the array and along a line parallel to columns of the array. At 704, for each respective differential signal pin pair of the plurality of differential signal pin pairs, form, on a surface of a substrate, a pair of signal pads being configured in a pattern to accept the corresponding pair of pins, each pair of pads configured to accept a differential signal pin pair positioned at a vertex of the array. Once each signal pad is formed for each differential signal pin pairs the method process ends.

Thus it is seen that a pin arrangement on an integrated circuit package that uses differential signals of similar amplitudes but different sign to balance, cancel, or reduce cross-talk, thereby avoiding mismatched signals on pins of a differential pin pair, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:
1. An integrated circuit package, comprising:
a printed circuit board having a major plane;
a first plurality of signal pins, each signal pin in the first plurality of signal pins extending in a first direction orthogonal to the major plane, the first plurality of signal pins being grouped into a second plurality of differential signal pin pairs, each differential signal pin pair in the second plurality of differential signal pin pairs being positioned at a vertex of a regular array of orthogonal rows and columns; and
a plurality of ground pins, each ground pin in the plurality of ground pins extending orthogonally to the major plane in the first direction, wherein:
each differential signal pin pair in the second plurality of differential signal pin pairs comprises a positive signal pin and a negative signal pin;
the second plurality of differential signal pin pairs comprises:
a first subset of differential signal pin pairs in which, in each differential signal pin pair, the positive signal pin and the negative signal pin are arranged relative to one another in a first orientation along a line parallel to rows of the array; and
a second subset of differential signal pin pairs in which, in each differential signal pin pair, the positive signal pin and the negative signal pin are arranged relative to one another in a second orientation along a line parallel to columns of the array;
for each differential signal pin pair in one of the first and second subsets, all nearest neighbor differential signal pin pairs belong to another of the first and second subsets; and
at least one ground pin of the plurality of ground pins is arranged between a first differential signal pin pair and a second differential signal pin pair, the at least one ground pin being disposed (a) along a line connecting a first vertex of the regular array of rows and columns at which the first differential signal pin pair is located to a second vertex of the regular array of rows and columns at which the second differential signal pin pair is located, and (b) along a line connecting a first differential signal pin in the first differential signal pin pair to a first differential signal pin in the second differential signal pin pair, and (c) along a line connecting a second differential signal pin in the first differential signal pin pair to a second differential signal pin in the second differential signal pin pair, to shield at least one differential signal pin in the first differential signal pin pair from signals in the second differential signal pin pair, or to shield at least one differential signal pin in the second differential signal pin pair from signals in the first differential signal pin pair.

2. The integrated circuit package of claim 1, wherein the ground pins are further positioned between differential signal pin pairs, the ground pins being disposed along one of the orthogonal rows and columns.

3. The integrated circuit package of claim 2, wherein additional ground pins are further positioned along a diagonal axis to surround each of the differential signal pin pairs in at least two spatial axes to shield cross-talk signals between neighboring differential signal pin pairs.

4. The integrated circuit package of claim 2, further comprising a plurality of ground vias configured to be electrically coupled to a ground of the printed circuit board; wherein:
at least one of the plurality of ground pins is electrically coupled to at least one of the plurality ground vias.

5. The integrated circuit package of claim 1, further comprising:
a plurality of signal via pairs, each signal via pair having a positive signal via and a negative signal via; and
a plurality of via anti-pads, wherein each via anti-pad is configured to separate the printed circuit board from each of the positive and negative signal vias.

6. The integrated circuit package of claim 5, wherein at least one of the second plurality of differential pin pairs is electrically coupled to at least one of the plurality of signal via pairs.

7. The integrated circuit package of claim 5, further comprising a plurality of signal trace pairs, routed in a plane parallel to the major plane, configured to transmit each of the differential signals, wherein the signal trace pairs comprise:
a positive signal trace; and
a negative signal trace; and
the signal trace pairs are routed such that the traces avoid electrical interference with signal via pairs and the second plurality of differential pin pairs.

8. The integrated circuit package of claim 7, wherein:
the positive signal pin of each differential signal pin pair in the second plurality of differential signal pin pairs is electrically coupled to the positive signal via of each of the plurality of signal via pairs; and
the negative signal pin of each differential signal pin pair in the second plurality of differential signal pin pairs is electrically coupled to the negative signal via of the each of the plurality of signal via pairs.

9. The integrated circuit package of claim 7, wherein:
the positive pin of each differential signal pin pair in the second plurality of differential signal pin pairs is electrically coupled to the positive signal trace of each of the plurality of signal trace pairs by way of a positive signal via; and
the negative pin of each differential signal pin pair in the second plurality of differential signal pin pairs is electrically coupled to the negative signal traces of each of the plurality of signal trace pairs by way of a negative signal via.

10. The integrated circuit package of claim 9, wherein:
the positive pin of each differential signal pin pair in the second plurality of differential signal pin pairs is configured to be electrically coupled to a corresponding positive signal pad of a plurality of corresponding signal pads of a substrate; and
the negative pin of each differential signal pin pair in the second plurality of differential signal pin pairs is configured to be electrically coupled to a corresponding negative signal pad of the plurality of corresponding signal pads of the substrate.

11. A method of fabricating an electronic device, the method comprising:
providing an integrated circuit device package having a plurality of differential signal pin pairs and a plurality of ground pins, each differential signal pin pair and ground pin extending in a first direction orthogonal to a surface of the integrated circuit device package, each differential signal pin pair of the plurality of differential signal pin pairs comprising a positive signal pin and a negative signal pin, wherein each of a first subset of differential signal pin pairs is arranged relative to each other differential signal pin pair of the first subset in a first orientation at a vertex of a regular array of orthogonal rows and columns and along a line parallel to rows of the array, and each of a second subset of differential signal pin pairs is arranged relative to each other differential signal pin pair of the second subset in a second orientation at a vertex of the array and along a line parallel to columns of the array, and wherein at least one ground pin of the plurality of ground pins is arranged between a first differential signal pin pair and a second differential signal pin pair, the at least one ground pin being disposed (a) along a line connecting a first vertex of the regular array of rows and columns at which the first differential signal pin pair is located to a second vertex of the regular array of rows and columns at which the second differential signal pin pair is located, and (b) along a line connecting a first differential signal pin in the first differential signal pin pair to a first differential signal pin in the second differential signal pin pair, and (c) along a line connecting a second differential signal pin in the first differential signal pin pair to a second differential signal pin in the second differential signal pin pair, to shield at least one differential signal pin in the first differential signal pin pair from signals in the second differential signal pin pair, or to shield at least one differential signal pin in the second differential signal pin pair from signals in the first differential signal pin pair;
for each respective differential signal pin pair of the plurality of differential signal pin pairs, forming, on a surface of a substrate, a pair of signal pads being configured in a pattern to accept the corresponding pair of pins, each pair of pads configured to accept a differential signal pin pair positioned at a vertex of the array; and
forming, on the surface of the substrate, ground pads configured in a pattern to accept the corresponding ground pins.

12. The method of fabricating an electronic device according to claim 11, further comprising:
fabricating a first plurality of signal pads on a surface of the substrate, wherein the substrate is a substrate of a printed circuit board for receiving a corresponding plurality of signal pins of the integrated circuit device package.

13. The method of fabricating an electronic device according to claim 11, further comprising:
fabricating a first plurality of signal pads on a surface of the substrate, wherein the substrate is a substrate inside an integrated circuit package for receiving a corresponding plurality of signal pins of the integrated circuit device package.

14. The method of fabricating an electronic device according to claim 11, further comprising:
routing a plurality of signal trace pairs within a printed circuit board on a plane parallel to the surface of the substrate, the signal trace pairs configured to transmit the differential signals, wherein the signal trace pairs comprise:
a positive signal trace; and
a negative signal trace.

15. The method of fabricating an electronic device according to claim 11, further comprising electrically coupling a plurality of ground vias to a ground of the printed circuit board.

16. The method of fabricating an electronic device according to claim 11, further comprising:
for each pair of pads positioned to accept a differential signal pin pair in one of the first and second subsets, fabricating all nearest neighbor pairs of pads such that all nearest neighbor pairs of pads receive differential pin pairs belonging to another of the first and second subsets.

17. The method of fabricating an electronic device according to claim 16, further comprising:
electrically coupling a plurality of signal via pairs to each of the plurality of signal trace pairs, wherein the signal via pairs comprise:
a positive signal via; and a negative signal via;

electrically coupling each of the positive signals vias of the plurality of signal via pairs to at least one of the positive signal traces of the signal trace pairs; and electrically coupling each of the negative signal vias of the plurality of signal via pairs to at least one of the negative signal traces of the signal trace pairs.

18. The method of fabricating an electronic device according to claim 17, further comprising:

positioning a plurality of via anti-pads, wherein each via anti-pad is configured to surround each of the positive and negative signal vias with a non-conductive pocket.

19. The method of fabricating an electronic device according to claim 18, further comprising:

in each pair of pads configured to accept a differential signal pin pair in the second plurality of differential signal pin pairs, electrically coupling a pad of the pair of pads, that is configured to accept the positive pin of differential signal pin pair in the second plurality of differential signal pin pairs, to the positive signal via of each of the plurality of signal via pairs; and electrically coupling a pad of the pair of pads, that is configured to accept the negative pin of differential signal pin pair in the second plurality of differential signal pin pairs, to the negative signal via of each of the plurality of signal via pairs.

20. The method of fabricating an electronic device according to claim 11, wherein mounting the plurality of ground pads further comprises positioning each of the plurality of ground pads along one of the orthogonal rows and columns, and between pairs of pads.

21. The method of fabricating an electronic device according to claim 20, wherein positioning each of the plurality of ground pads further comprises surrounding each of the pairs of pads to shield cross-talk signals between neighboring pairs of pads.

* * * * *